(12) United States Patent
Caron et al.

(10) Patent No.: US 6,350,387 B2
(45) Date of Patent: *Feb. 26, 2002

(54) MULTILAYER COMBINED RIGID/FLEX PRINTED CIRCUIT BOARD CONTAINING FLEXIBLE SOLDERMASK

(75) Inventors: A. Roland Caron; Sandra L. Jean, both of Hudson; James E. Keating, Litchfield; Robert S. Larmouth, Londonderry; Lee J. Millette, Litchfield, all of NH (US)

(73) Assignee: Teledyne Industries, Inc., Los Angelos, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/260,198

(22) Filed: Mar. 1, 1999

Related U.S. Application Data

(62) Division of application No. 08/800,844, filed on Feb. 14, 1997, now abandoned.

(51) Int. Cl.$^7$ .................................................. H05K 3/46
(52) U.S. Cl. .............................. 216/20; 216/36; 427/96; 174/254
(58) Field of Search .............................. 216/13, 18, 20, 216/36; 427/96; 174/254

(56) References Cited

U.S. PATENT DOCUMENTS

| | | | | |
|---|---|---|---|---|
| 5,262,280 A | * | 11/1993 | Knudsen et al. | 430/312 |
| 5,499,444 A | * | 3/1996 | Doane, Jr. et al. | 29/830 |
| 5,723,205 A | * | 3/1998 | Millette et al. | 428/209 |

FOREIGN PATENT DOCUMENTS

| WO | WO009524821 | * | 9/1995 | H05K/3/00 |
|---|---|---|---|---|

* cited by examiner

*Primary Examiner*—Randy Gulakowski
*Assistant Examiner*—Allan Olsen
(74) *Attorney, Agent, or Firm*—Hayes, Soloway, Hennessey, Grossman & Hage, P.C.

(57) ABSTRACT

A multilayer rigid flex printed circuit board wherein the board laminate comprises a basestock composite containing a flexible core, formed by laminating a first conductive layer to a flexible insulator layer, a second insulator layer affixed to the basestock, said second insulator layer having a cutout region proximate to the flexible core of the basestock composite to expose a portion of said first conducting layer on said flexible core, a second conductive layer attached to said second insulator layer said second conductive layer having a cutout region proximate to the flexible core of the basestock composite, and a photo-imageable soldermask applied to the exposed portion said first conducting layer, and to the second conductive layer, wherein said photoimageable soldermask allows for photo definition of openings on the conductive layers to which it is applied.

1 Claim, 3 Drawing Sheets

MULTILAYER COMBINED RIGID/FLEX PRINTED CIRCUIT BOARD CONTAINING FLEXIBLE SOLDERMASK

This is a continuation divisional of application(s) Ser. No. 08/800,844 filed on Feb. 14, 1997 now abandoned.

FIELD OF THE INVENTION

The present invention relates to the fabrication of multilayer combined rigid and flex printed circuit boards wherein a flexible soldermask replaces traditional polyimide film in the flex area. In addition, the flexible soldermask, being photo-imageable, can be placed on both the rigid and flexible sections at the same time, thus allowing photo definition of the openings in one or both areas. Furthermore, the method of fabrication eliminates the need of additional process steps to fabricate the flexible inner layers as required by prior art construction techniques.

BACKGROUND OF THE INVENTION

Techniques for making multilayer rigid flex printed circuit boards are well known in the field. One early example of the prior art is disclosed in U.S. Pat. No. 3,409,732 assigned to the assignee of the present application. Typically, a rigid flex stacked printed circuit board includes flexible printed circuit cables extending from the periphery of the rigid section or sections. The rigid portions of the flex cables are typically used as sites for electronic components or mechanical hardware. It is important to note that the copper conductor in each plane or layer is fabricated from one continuous sheet of copper foil.

Typically, and as disclosed in detail in U.S. Pat. No. 4,800,461, also assigned to the assignee of the present invention, in the construction of a multilayer rigid flex circuit board, the initial processing step includes formation of a basestock by laminating two copper sheets to an insulator layer comprising one or two fiberglass sheets impregnated with an adhesive such as an epoxy, commonly referred to as a prepreg. Following lamination, the copper layers can be imaged and etched to provide copper pads and conductors. The exposed copper conductor patterns are then treated to enhance bondability of an epoxy prepreg to the copper. Then, two additional insulator prepreg sheets having cutouts are positioned on both sides of the base stock. A flexible insulator of Kapton (polyimide) covered with a suitable adhesive which provides bonding to copper is positioned on both sides of the cutout section. In addition, the Kapton sheets are slightly longer than the cutout sections in the glass layers to overlap by, for example, 0.050 inch. The sandwich formed by the foregoing sheets is then laminated together to provide a rigid flex board, where in the Kapton provides excellent flexibility and tear resistance characteristics to the flex section.

Of additional general background interest, attention is directed to U.S. Pat. No. 5,499,444, entitled "Method of Manufacturing a Rigid Flex Printed Circuit Board". In said patent, it is reported the fabrication of multilayer boards with the above referenced materials has led to some persistent problems. First. alignment of circuitry at different layers in the board is critical, and provisions must be made to prevent sliding of any layers in different planes with respect to other planes by more than a tolerance of a few thousandths of an inch. Maintaining registration of the flexible portion has also been a serious problem, since the hard board must be cured or laminated by a heat-press process that is likely to cause interlayer slippage as well as thermal dimensional changes. Other problems are encountered due to the thermal expansion of the typically used insulator materials such as acrylic adhesive and the polyimide film utilized in the construction of the rigid flex boards. Thus, failures occur when the board is subjected to elevated temperatures in thermal stress testing, hot oil solder reflow, and the like.

Another difficulty with the use of dielectric films such as Kapton film in the rigid board area is their absorption of excessive moisture, on the order of up to 3 percent by weight of water. Absorbed moisture in the circuitry, with no means of escape, may cause unacceptable delamination in the rigid board area when it volatilizes during fabrication or during subsequent high temperature operation. This effect may be more destructive than simple mismatch of thermal coefficients.

The foregoing problems have in one form or another been addressed in the prior art, as shown for example in U.S. Pat. No. 4,800,461; U.S. Pat. No. 5,144,742 and U.S. Pat. No. 5,004,639. Approaches in addressing one or more of the problems involve such construction techniques as adding pads in nonfunctional layers of the plated through holes; utilizing a curable liquid dielectric for certain layers or portions of layers; using temporary sheet patches of filler material surrounding flex regions during a heat pressing assembly stage to maintain alignment; adding glass fiber reinforcement of the flex layer for strengthening; and finally, a number of other changes or addition to the manufacturing process. However, each of these solutions entails additional steps to address any one responsible for moisture absorption and failure of plated through holes in multilayer boards at high temperatures. Reducing the size of the polyimide/ acrylic components to limit thermal stress introduces boundary problems where flexible and rigid elements are patched together. Furthermore, many of these improvements require more detailed manufacturing steps that can be costly as well as time consuming.

In U.S. Pat. No. 5,499,444, a rigid flex printed circuit board is prepared via a process wherein each circuit layer is punched in the peripheral regions with alignment slots and all layers are assembled without any acrylic bonding in a single hot press operation. More specifically, a central layer is formed of a sheet of epoxy/glass material with top and bottom copper foil layers. This central layer is cured and punched with slots at its edge, of which a portion thereof ultimately provides formation of the flexible portion of the finished board. The slots allow motion along only one of two orthogonal axes, and subsequently the punched layers (with windows for formation of the flexible region) and the central portion are assembled in a single press curing operation in which process-induced motions and realignments are constrained to occur with a small magnitude that varies with the radial position along an alignment rosette centered on the board. A top or final cover layer extends over both the flexible and rigid regions to further assure uniform alignment at all levels during pressure assembly. The '444 Patent emphasizes that by using a glass/epoxy layer for the central flexible portion instead of some form of polyimide or other material, an all glass construction is achieved that is free of the major problem of z-axis thermal stresses of the conventional polyimide-glass construction. Furthermore, it is mentioned that on top of the copper layer in the flex section is a cover of insulating material which may be an adhesively bonded plastic film or a coated-on film, such as a conformal cover coat known in the art, suitable of which is a solder mask such as a UV curable flexible solder resist or a heat curable preparation both of which can be applied by a screening operation. This cover material is then described as being cured before assembly with subsequent layers.

In U.S. Pat. No. 5,144,742 there is disclosed a rigid flex printed circuit board fabricated by the steps of first forming circuitry components on a rigid flex subassembly including laminated conductive layers on opposite sides of a central insulating layer. This is followed by depositing a liquid precursor of flexible insulating layers over the circuitry components in portions of the printed circuit board subassembly corresponding to the flexible section in the final rigid flex board. The liquid precursor is then cured to form an insulating layer as a protective coating over the circuitry components in the flexible section, which is followed by finally laminating a plurality of components including at least one rigid flex subassembly and rigidizing insulating layers to form a rigid flex printed circuit board.

Finally, attention is directed to "High Resolution Photoimageable Covercoats for Flex Applications", a paper presented at "Flexcon 95" by W. J. Thatcher and P. M. Banks. As disclosed therein, the product sold under the tradename Imageflex™ has become processable film with a gloss or matt finish. It is mentioned therein that Imageflex™ has proven suitable in a variety of flexible circuit applications. The Imageflex™ is said to offer significant advantages for the product of many types of flexible printed circuits, as an alternative to polyimide coverlay, the Imageflex™ offering lower cost and higher feature resolution and alignment accuracy. In addition, a photoimageable solder mask is now available from Taiyo, Japan.

Accordingly, as can be seen from the above review of the prior art, in the case of manufacturing a rigid flex printed circuit board, there has been an on-going effort to develop the most efficient and cost effective manufacturing process to address the various problems in the art.

It is therefore an object of the present invention to provide what is considered to be an even further cost effective route for the preparation of a rigid flex circuit board, where the rigid flex circuit board itself provides an entirely new overall construction, and wherein the manufacturing process eliminates the use of polyimide film in the flex section as a covercoat. More particularly, it is an object of the present invention to develop a process which makes use of photoimageable solder mask, on both the rigid and flexible sections, at the same time.

Accordingly and with regard to the method disclosed herein, the present invention has as its further objective and result the elimination for the need of additional process steps to fabricate flexible inner layers in a rigid flex printed board design, and provides an economical and cost-efficient route for assembly of boards with characteristic rigid-flex construction.

SUMMARY OF THE INVENTION

By way of summary, the present invention comprises a multilayer rigid flex printed circuit board wherein the board laminate comprises a basestock composite containing a flexible core, formed by laminating a first conductive layer to a flexible insulator layer, along with a second insulator layer affixed to the basestock, said second insulator layer having a cutout region proximate to the flexible core of the basestock composite to expose a portion of said first conducting layer on said flexible core, and a second conductive layer is attached to said second insulator layer, said second conductive layer also having a cutout region proximate to the flexible core of the basestock composite. A photoimageable soldermask is then applied to said exposed portion of said first conductive layer, and to the second conductive layer, wherein said photoimageable soldermask allows for photo definition of openings upon the conductive layers upon which it is applied.

In method form, the present invention comprises a process for the preparation of a multilayer rigid flex circuit board comprising the steps of laminating a first conductor layer to a first flexible insulating layer to form a basestock composite wherein said first conductor layer contains a flexible core section, imaging and etching said first conductor layer to form conductor patterns, laminating a second conductive layer to a second insulating layer wherein said second conductive layer contains a cover section thereof which covers said flexible core section and which does not bond to said flexible core section, laminating said first conductor layer and said second conductive layer together to form a rigid section, removing said cover section covering said flexible core section to expose said flexible core section and coating said second conductive layer and said exposed flexible core section with a photo-imageable solder mask and photo defining openings therein.

BRIEF DESCRIPTION OF THE DRAWINGS

Various features of the invention will be understood with reference to the FIGS. below and the description thereof, wherein.

DETAILED DESCRIPTION OF THE PREFERRED EMBODIMENTS

Figure 1:
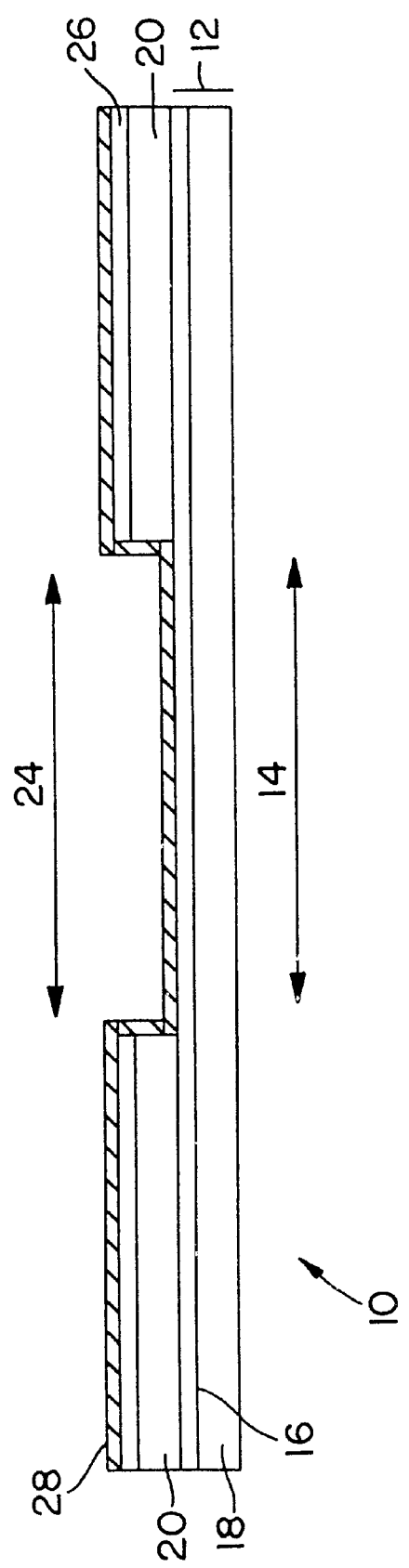
FIG. 1 illustrates a side-view of the rigid flex printed circuit board in accordance with the present invention.

With reference now to FIG. 1, the present invention comprises a multilayer rigid flex circuit board 10 wherein the board laminate contains a basestock composite 12 containing a flexible core section 14 formed by laminating a first conductive layer 16 to a flexible insulator layer 18. The flexible insulating layer may be either epoxy prepreg or polyimide film or combination of the two. A second insulator layer 20 is affixed to the basestock, said second insulator layer having a cutout region 24 proximate to the flexible core 14 of the basestock composite to expose said first conducting layer on said flexible core. A second conductive layer 26 is attached to said second insulator layer 20 said second conductive layer also having a cutout region 24 proximate to the flexible core 14 of the basestock composite. A photoimageable soldermask 28 is then applied to said first and second conductive layers wherein said photoimageable soldermask allows for photo definition of openings on either said first or second conductive layers.

Preferably, conductive layers 16 and 26 comprise copper sheet of one or two ounce copper, and the flexible insulating layer 18 comprises fiberglass sheet impregnated with an epoxy adhesive. However, conductive layers have been employed ranging from as low as 9 micron. In the preferred process of manufacturing, the impregnated fiberglass sheet is bonded to the conductive layer 16.

Holes may be drilled in the rigid section, followed by cleaning and plating through the holes to form conductive barrels connecting conductors in the conductor pattern of the rigid section. In addition, the manufacturing process may contain the step of surface coating the photo defined openings in order to prevent oxidation. The surface coating may comprise a tin/lead coating, a gold coating, or an organic coating.

The preferred photo-imageable solder mask comprises a flexible thermal hardening two component liquid photo-imageable solder mask sold under the trademark Imageflex™ and available from Coates ASI. Particularly preferred is the two components system known as XV600T Imageflex™ Resist and XV600T Imageflex™ Hardener. In process form, it has been found preferable to employ a spray coating machine which insures more even distribution of the material across the conductive surfaces. Preferably, the flexible photo-imageable solder mask is applied and cures to a thickness that is relative to the thickness of the conductive foil layer. For example, if the conductive foil is 9 microns thick, the photoimageable solder mask is set to a thickness of about 1 mil. On the other hand, if the conductive foil were 2 ounce copper, then the mask thickness would be about 3 mils thick.

With regards to thickness dimensions, it should be also be pointed out at this time that preferably, insulating layer 18 as illustrated in FIG. 1, in the case of an adhesiveless polyimide film, will range from about 0.5 mil to 3 mils. On the other hand if the insulating layer 18 is prepreg, thickness will preferably range from about 1.5 to 5.0 mils. Furthermore, insulating layer 20 also will range from about 1.5 mils to 5.0 mils.

With respect to FIG. 1, several advantageous characteristics of the present invention over prior art rigid flex designs are now worthy of note. First, the flexible soldermask replaces the traditional and expensive polyimide film covercoats in the flex area. Furthermore, the flexible soldermask, being liquid photo-imageable, is now placed on both the rigid and flexible sections, thereby allowing for photo definition of openings in one or both areas, and can be conveniently placed upon such surfaces after final lamination. This type of construction and associated fabrication eliminates the need of additional process steps to fabricate the flexible inner layers which was required by prior art techniques.

Figure 2:
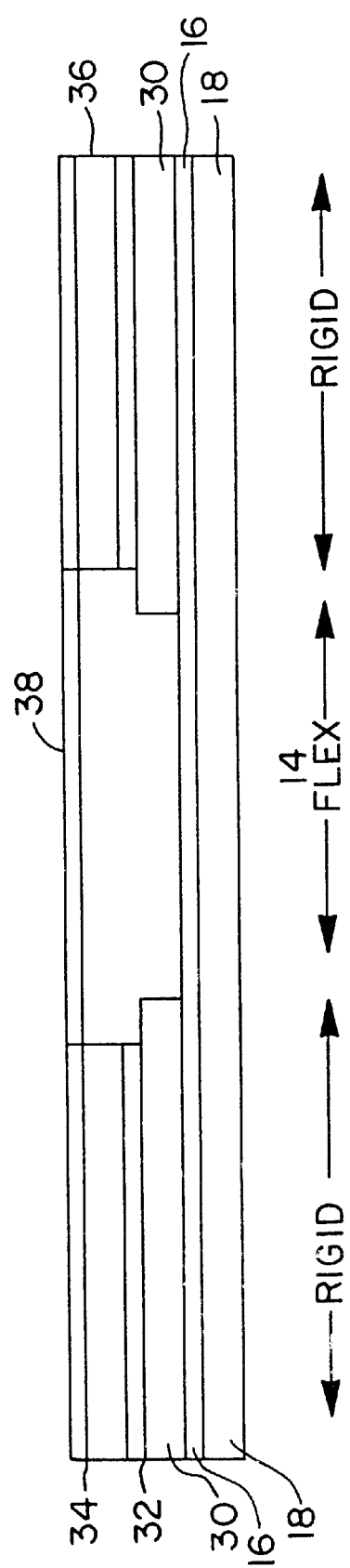
FIG. 2 illustrates a side view of the rigid flex printed circuit board in accordance with the present invention, emphasizing the placement of the cover section which does not bond to the flexible core and which acts as a protective barrier over the flexible section during fabrication.

In yet another preferred construction, it has been found that if insulating layer 30 is made to overlap a section of the flexible core 14, as is shown in greater detail in FIG. 2, the transition from the flexible region to the rigid section is less severe, in the sense that such construction reduces any stresses that may occur as between the rigid and flexible sections when such sections are bent or deflected relative to one another.

For the manufacture of the rigid flex circuit of the present invention, and again with reference to FIG. 1, the process begins with the steps of laminating a first conductor layer 16 to a first flexible insulating layer 18 to form a basestock composite wherein said first conductor layer ultimately will define a flexible core section 14. That is, a portion of this basestock will act as the flexible section thereof, while the peripheral ends become sandwiched within the rigid board regions.

The above steps are preferably followed by imaging and etching said first conductor layer to form conductor patterns on conductor surface 16. Attention is now directed to FIG. 2, which more clearly illustrates the above referenced optional embodiment wherein one laminates a second insulating layer of fiberglass/epoxy prepreg 30 to conductive layer 16 so that said second insulating layer overlaps a section of the flexible core 14. As noted above, pursuant to this now illustrated construction, stress is reduced as between the rigid section and flexible section when the multilayer rigid flex board is employed in final application.

Conductive layers 32 and 34 (see again, FIG. 2) are then laminated to insulating layer 36 wherein conductive layer 34 is designed to extend across the flexible core section 14 and to form a cover section 38 which covers said flexible core section, and which does not bond to said flexible core section in final lamination. That is, one laminates said first conductor layer 16 to insulating layer 30 and to said second conductive layers 32 and 34 to form a rigid section, as shown in FIG. 2, with conductive layer 34 spanning over flexible section 14.

While in preferred embodiment, conductive layer 34 is illustrated as covering flexible section 14, it will be appreciated that any suitable cover material will function in like manner, provided said covering material does not bond to the flexible region 14 during lamination. In this regard, cover section 38 may for example comprise an insulating material, provided such insulating material does not bond to the conductor surface 16 of the flexible section in the step of final lamination.

In the final step of manufacture, the cover section 38 covering said flexible core section is then removed to expose the flexible core section 14 followed by coating of said second conductive layer 34 which is the rigid section and said exposed conductive surfaces of flexible core section 14 with a photo-imageable solder mask and photo defining openings therein.

Figure 3:
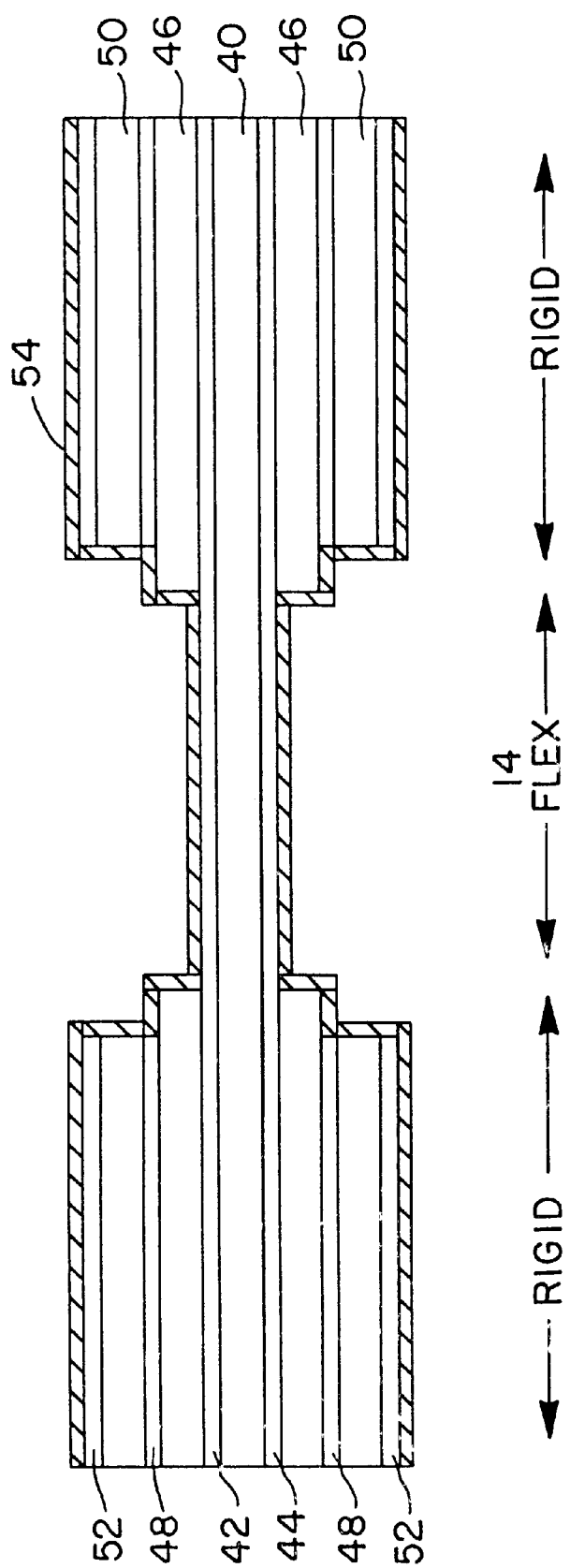
FIG. 3 illustrates yet another side view of the rigid flex printed circuit board of the present invention, in a preferred embodiment thereof.

In yet another alternative embodiment, and as illustrated in FIG. 3, a multi-layer rigid flex printed circuit board can be prepared pursuant to the above process of manufacture. As shown therein, an inner flexible insulating inner layer contains conducting surfaces 42 and 44. Laminated thereon layers of prepreg 46 which extend. partially into the flex region. This is followed by a rigid cap material comprising conducting layers 48 and 52 with insulating layer 50 therebetween. Finally, the flexible photoimageable solder mask covers 54 the exposed conducting surfaces.

What is claimed is:

1. A process for the preparation of a multilayer rigid flex circuit board consisting essentially of:

laminating first conductive layers to both sides of a first flexible insulating layer to form a basestock composite wherein said basestock contains a flexible core section;

imaging and etching both of said first conductive layers to form conductor patterns;

affixing an intermediate insulating layer to each side of said basestock, each of said intermediate insulating layers having a cutout region proximate to said flexible core section to expose said first conductive layer on said flexible core section, said intermediate insulating layers overlapping a portion of said flexible core section;

preparing two multilayer external sections for lamination to said intermediate insulating layers, each said external section prepared by:

laminating a second conductive layer to the lower side of an outer insulating layer, said second conductive layer and said outer insulating layer having a cutout region of a shape and size congruent to the shape and size of said flexible core section; and laminating a third conductive layer to the upper side of said outer insulating layer, wherein said third conductive layer contains a cover section thereof which covers said cutout region congruent to said flexible core section laminating each of said intermediate insulating layers and each of said second conductive layers together to form a multilayered rigid section with each of said third conductive layers being, outermost, whereby each of said cover sections spans across said flexible core section and does not bond thereto;

removing said cover sections covering said flexible core section to expose both sides of said flexible core section; and coating said third conductive layers and both sides of said exposed flexible core section with a photo-imageable solder mask which allows for photo definition of openings on the exposed conductive surfaces of said multilayered rigid sections and said flexible core section.

* * * * *